United States Patent
Moussaoui et al.

(10) Patent No.: US 10,643,959 B2
(45) Date of Patent: May 5, 2020

(54) METHOD OF MAKING A STACKED INDUCTOR-ELECTRONIC PACKAGE

(71) Applicant: INTERSIL AMERICAS LLC, Milpitas, CA (US)

(72) Inventors: Zaki Moussaoui, Palm Bay, FL (US); Nikhil Vishwanath Kelkar, Saratoga, CA (US)

(73) Assignee: Intersil Americas LLC, Milpitas, CA (US)

( * ) Notice: Subject to any disclaimer, the term of this patent is extended or adjusted under 35 U.S.C. 154(b) by 68 days.

(21) Appl. No.: 15/453,889

(22) Filed: Mar. 8, 2017

(65) Prior Publication Data
US 2017/0179048 A1 Jun. 22, 2017

Related U.S. Application Data

(62) Division of application No. 12/962,053, filed on Dec. 7, 2010, now Pat. No. 9,607,917.
(Continued)

(51) Int. Cl.
*H01L 23/64* (2006.01)
*H01L 23/31* (2006.01)
(Continued)

(52) U.S. Cl.
CPC ........ *H01L 23/645* (2013.01); *H01L 23/3107* (2013.01); *H01L 23/3675* (2013.01);
(Continued)

(58) Field of Classification Search
CPC ........ H05K 5/06; H05K 5/059; H05K 3/3447; H05K 3/3484; H05K 3/3494;
(Continued)

(56) References Cited

U.S. PATENT DOCUMENTS 5,015,981 A * 5/1991 Lint ............... H01F 27/027
                                                29/602.1
5,365,403 A   11/1994 Vinciarelli et al.
(Continued)

FOREIGN PATENT DOCUMENTS

CN    101459152    6/2009
CN    101488748    7/2009
(Continued)

OTHER PUBLICATIONS

Patent Reexamination Board of the Patent Office of the State Intellectual Property Office of the People's Republic of CH, "Decision on Reexamination from CN Application No. 201010593746.X dated Mar. 17, 2016", "from Foreign Counterpart of U.S. Appl. No. 12/962,053", Mar. 17, 2016, pp. 1-40, Published in: CN.
(Continued)

*Primary Examiner* — Carl J Arbes
(74) *Attorney, Agent, or Firm* — Foley & Lardner LLP

(57) ABSTRACT

An embodiment of a circuit includes a circuit module and an inductor disposed over and electrically coupled to the module. Disposing the inductor over the module may reduce the area occupied by the circuit as compared to a circuit where the inductor is disposed adjacent to the module, or to a circuit where the inductor is disposed in the module adjacent to other components of the module. Furthermore, disposing the inductor outside of the module may allow one to install or replace the inductor.

7 Claims, 8 Drawing Sheets

Related U.S. Application Data

(60) Provisional application No. 61/267,117, filed on Dec. 7, 2009.

(51) Int. Cl.

| | | |
|---|---|---|
| *H01L 23/495* | (2006.01) | |
| *H01L 25/16* | (2006.01) | |
| *H01L 25/00* | (2006.01) | |
| *H01L 23/367* | (2006.01) | |
| *H01L 23/48* | (2006.01) | |
| *H01L 23/00* | (2006.01) | |
| *H05K 3/34* | (2006.01) | |

(52) U.S. Cl.
CPC ......... *H01L 23/481* (2013.01); *H01L 23/495* (2013.01); *H01L 23/49531* (2013.01); *H01L 23/49555* (2013.01); *H01L 23/49575* (2013.01); *H01L 24/96* (2013.01); *H01L 25/165* (2013.01); *H01L 25/50* (2013.01); *H05K 3/3447* (2013.01); *H05K 3/3484* (2013.01); *H05K 3/3494* (2013.01); *H01L 2924/0002* (2013.01); *H01L 2924/13091* (2013.01); *H01L 2924/14* (2013.01); *H01L 2924/1433* (2013.01); *H01L 2924/19041* (2013.01); *H01L 2924/19042* (2013.01); *H01L 2924/19043* (2013.01); *H01L 2924/19102* (2013.01); *H01L 2924/19105* (2013.01); *Y10T 29/4902* (2015.01)

(58) Field of Classification Search
CPC ............ H01L 23/3107; H01L 23/3675; H01L 23/481; H01L 23/495; H01L 23/49531; H01L 23/49555; H01L 23/49575; H01L 23/645; H01L 24/96; H01L 25/165; H01L 25/50; H01L 2924/00; H01L 2924/0002; H01L 2924/13091; H01L 2924/14; H01L 2924/1433; H01L 2924/2924; H01L 2924/19041; H01L 2924/19042; H01L 2924/19043; H01L 2924/19102; H01L 2924/19105

See application file for complete search history.

(56) References Cited

U.S. PATENT DOCUMENTS

| | | | |
|---|---|---|---|
| 5,675,192 A | 10/1997 | Ashley et al. | |
| 6,225,560 B1 * | 5/2001 | Machado | H01F 27/027 |
| | | | 174/535 |
| 6,366,486 B1 | 4/2002 | Chen et al. | |
| 6,394,822 B1 * | 5/2002 | McNamara | H01R 13/6585 |
| | | | 439/108 |
| 6,395,983 B1 * | 5/2002 | Gutierrez | H01L 23/057 |
| | | | 174/551 |
| 6,593,840 B2 * | 7/2003 | Morrison | H01F 27/292 |
| | | | 336/192 |
| 8,153,473 B2 | 4/2012 | Lotfi et al. | |
| 8,338,928 B2 | 12/2012 | Chen et al. | |
| 2010/0085139 A1 | 4/2010 | Yan et al. | |
| 2011/0102963 A1 | 5/2011 | Sekoguchi | |

FOREIGN PATENT DOCUMENTS

| | | | |
|---|---|---|---|
| EP | 2056659 | | 5/2009 |
| TW | 200849504 | | 12/2008 |
| WO | 99/27545 | * | 6/1999 |

OTHER PUBLICATIONS

State Intellectual Property Office of the Peoples Republic of China, "Notice on Reexamination from CN Application No. 201010593746.X dated Dec. 12, 2015", "from Foreign Counterpart of U.S. Appl. No. 12/962,053", dated Dec. 15, 2015, pp. 130, Published in: CN.

Taiwan Intellectual Property Office, "Notice of Allowance from TW Application No. 099141672", "from U.S. Appl. No. 12/962,053", dated Jan. 23, 2017, pp. 1-3, Published in: CN.

United States Patent and Trademark Office, "Final Office Action", "from U.S. Appl. No. 12/962,053", dated Mar. 12, 2013, pp. 1-14, Published in: US.

United States Patent and Trademark Office, "Notice of Allowance", "from U.S. Appl. No. 12/962,053", dated Nov. 9, 2016, pp. 1-16, Published in: US.

United States Patent and Trademark Office, "Office Action", "from U.S. Appl. No. 12/962,053", dated Oct. 30, 2014, pp. 1-13, Published in: US.

United States Patent and Trademark Office, "Office Action", "from U.S. Appl. No. 12/962,053", dated Mar. 14, 2014, pp. 1-15, Published in: US.

United States Patent and Trademark Office, "Office Action", "from U.S. Appl. No. 12/962,053", dated Mar. 17, 2016, pp. 1-14, Published in: US.

United States Patent and Trademark Office, "Office Action", "from U.S. Appl. No. 12/962,053", dated Jul. 3, 2012, pp. 1-12, Published in: US.

* cited by examiner ated patent application Ser. No. 12/962,053, filed on Dec. 10, 2010,
which claims the benefit of U.S. Provisional Patent Application Ser. No. 61/267,117 filed on Dec. 7, 2009; both of
which applications are incorporated herein by reference in
their entirety.

METHOD OF MAKING A STACKED INDUCTOR-ELECTRONIC PACKAGE

CLAIM OF PRIORITY

The present application is a divisional of U.S. patent application Ser. No. 12/962,053, filed on Dec. 10, 2010, which claims the benefit of U.S. Provisional Patent Application Ser. No. 61/267,117 filed on Dec. 7, 2009; both of which applications are incorporated herein by reference in their entirety.

TECHNICAL FIELD

An embodiment of provides a combination design of packaging and assembly that improves upon the conventional art by providing a better form factor, flexibility in selection of the inductor by the user, and a better heat dissipation mechanism for the heat generated by the inductor.

SUMMARY

An embodiment of a circuit includes a circuit module and an inductor disposed over and electrically coupled to the module. For example, the circuit module may be a power-supply module, and the power-supply module and inductor may together form part or all of a power supply. Disposing the inductor over the module may reduce the area occupied by the circuit as compared to a circuit where the inductor is disposed adjacent to the module, or as compared to a circuit where the inductor is disposed in the module adjacent to other components of the module. Furthermore, disposing the inductor outside of the module may allow one to install or replace the inductor.

DETAILED DESCRIPTION

Figure 1:
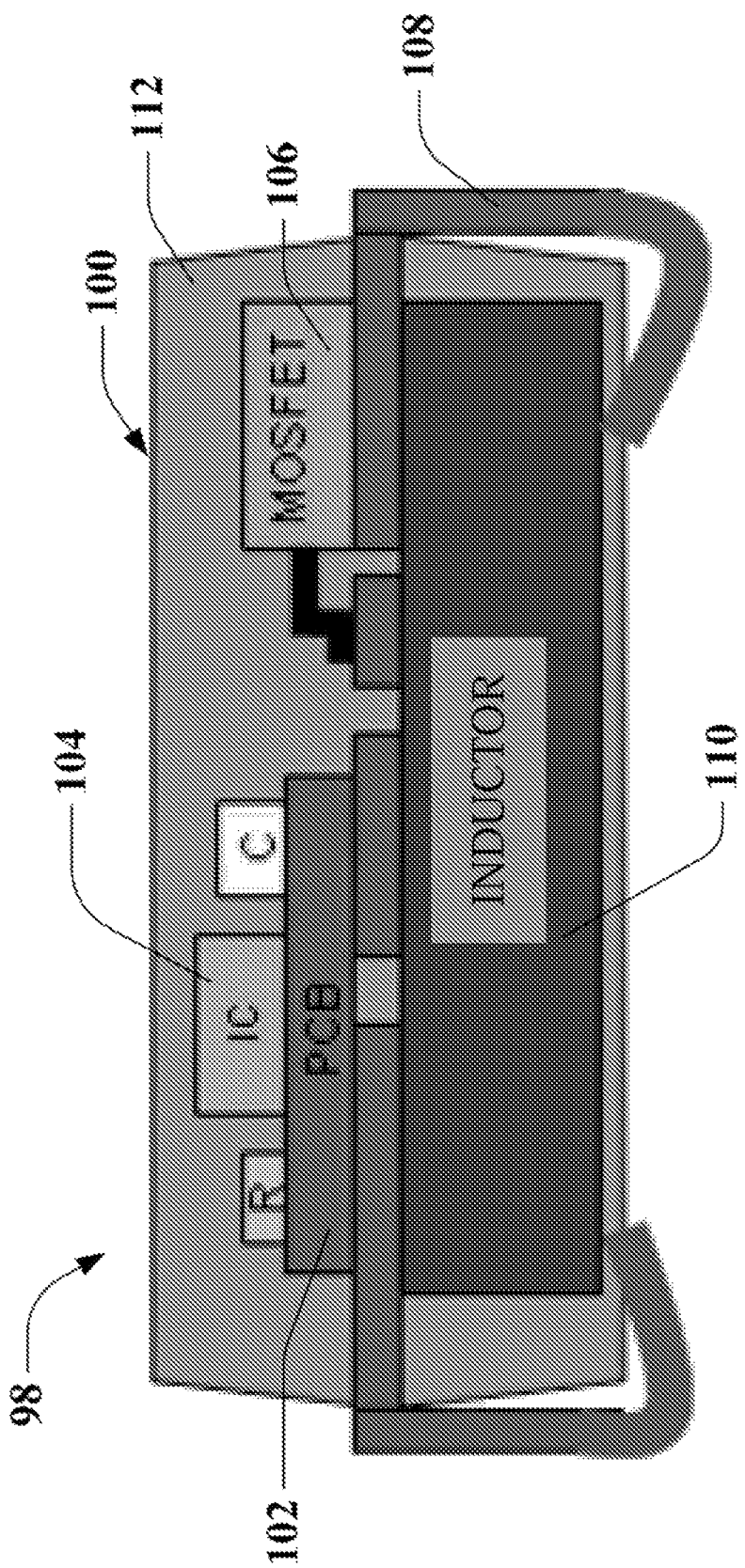
FIG. 1 illustrates a package for a power supply module.

One or more embodiments are described with reference to the drawings, wherein like reference numerals are used to refer to like elements throughout. In the following description, for purposes of explanation, numerous specific details are set forth in order to provide a thorough understanding of the one or more embodiments. It may be evident, however, that one or more embodiments may be practiced without these specific details. In other instances, well-known structures and devices are shown in block diagram form in order to facilitate describing one or more embodiments.

FIG. 1 illustrates an embodiment of a power-supply module 98, which includes a package 100, a printed circuit board (PCB) 102, an integrated circuit chip (IC) 104, a resistor R, a capacitor C, at least one field effect transistor 106, electrical contacts or traces that extrude externally from the package and form package leads (or pins) 108, and the choke, i.e., inductor, 110. The package body 100 is formed from encapsulating material 112, which also fills the empty spaces between the components 102, 104, 106, 108, 110, R and C. The inductor 110 is designed to block (i.e., have a high reactance to) a particular frequency in an electrical circuit while passing signals of much lower frequency, e.g., or direct current. That is, the inductor 110 may be used to block alternating current (AC) while passing DC. Furthermore, the encapsulating material 112 may include ceramic, plastic, epoxy or other insulation material.

Figure 2:
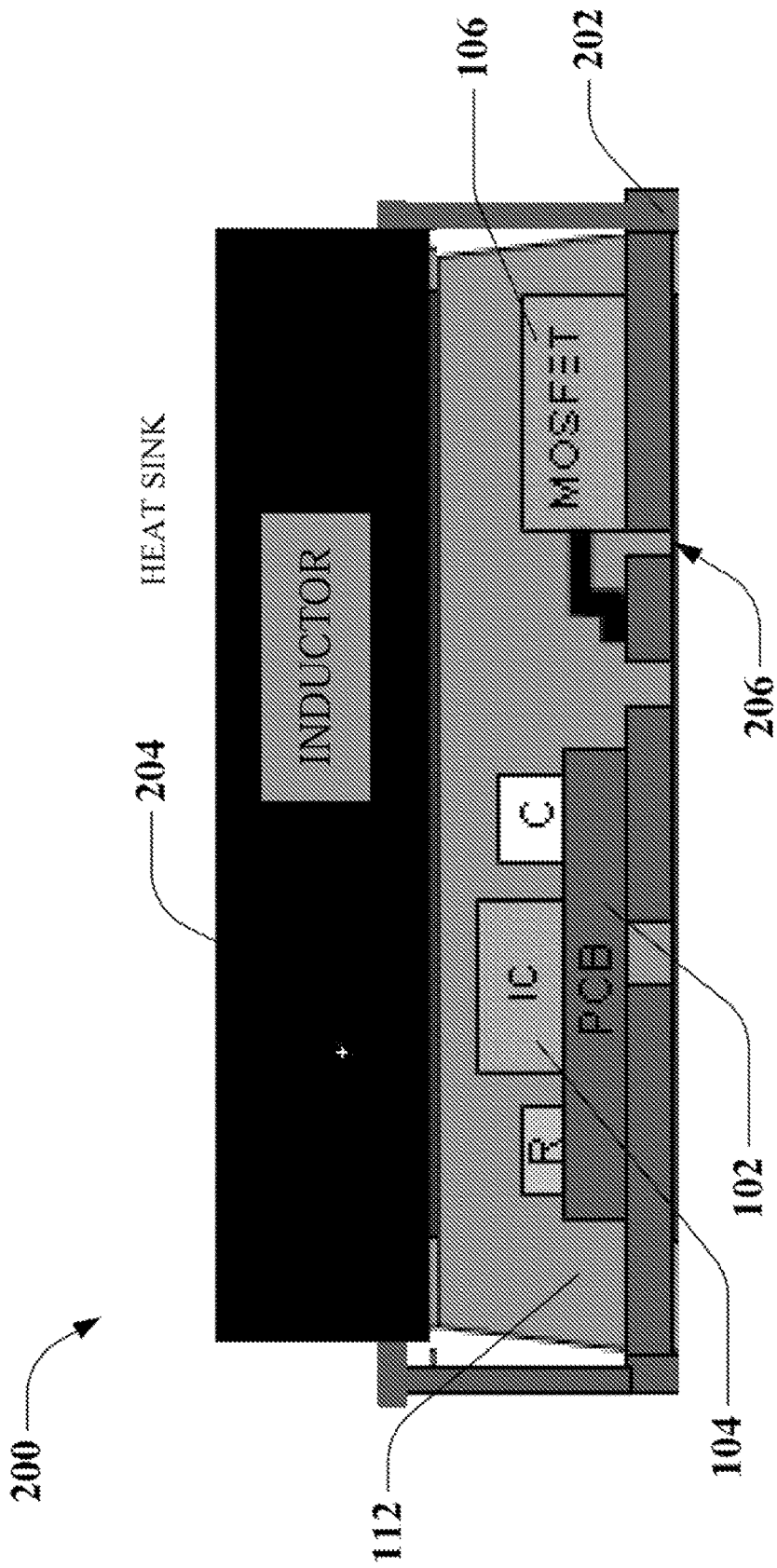
FIG. 2 illustrates an embodiment of a stacked inductor-package assembly.

FIG. 2 illustrates an embodiment of a stacked inductor-package assembly 200. The assembly 200 includes at least one inductor 204 stacked on top of, and external to, a module (e.g., a power-supply module) 206. The inductor 204 may include a choke inductor, a coupled inductor, or other type of inductor. The inductor 204 is external to the module 206 and is electrically and mechanically coupled to the module 206 by way of the external leads 202 of the module. A potential advantage of an embodiment of the assembly 200 is that it may allow the user/customer of the module 206 to select the type of inductor 204, and, therefore, may provide for flexible application of the module.

For example, a customer may select coupled inductors as the at least one inductor 204. Coupled inductors include two or more magnetically coupled inductors, for example, as in a transformer, wherein a change in current in one inductor induces a voltage across (and perhaps a current through) another magnetically coupled inductor.

In another example, a customer may select one or more uncoupled inductors (e.g., an inductor with a magnetic core or with an air core that is not magnetically coupled to another inductor) as the at least one inductor 204 for controllably and periodically storing and releasing energy.

In yet another example, a customer may select one or more choke inductors as the at least one inductor 204.

Thus, an embodiment of the stacked inductor-package assembly 200 of FIG. 2 may provide an advantage over the module 98 of FIG. 1, in which the inductor is selected before it is encapsulated in the package 100. Another potential advantage of an embodiment of the stacked inductor-package assembly 200 of FIG. 2 is that because the at least one inductor 204 is stacked on top of the module 206, and is outside of the module 206, there may be better dissipation of the heat generated by the inductor 204. The open area above the inductor 204 allows the heat generated by the inductor to escape; a heat sink may be mounted on top of the inductor to further facilitate cooling of the inductor 204. Inductors may heat up during operation; in fact, inductors may be one of the largest heat sources in electrical circuits, and if the temperature of an inductor becomes too high, the inductor may malfunction, or cause other components of the circuit to malfunction. Heat sinks or cooling fans may be used to dissipate the heat. But it may be said that an embodiments of the module 206 provides for a natural heat sink by locating the inductor 204 outside the module 206.

Another potential advantage of an embodiment of the module 200 is that the space vacated by the inductor 204 inside the module 206 may be used for implementing additional circuitry and functionality. For example, a multi-phase power-supply-module may be implemented inside the module 206 without increasing the size of the module (relative to the module prior to the removal of the inductor from within the module package). A multi-phase solution provides multiple current output signals (that are combined to produce a single regulated output voltage) differing in their phases, generally by 360°/(# of phases). A multi-phase solution may require additional circuitry compared to a single-phase solution. Or, the assembly 200 may form multiple power supplies that generate multiple regulated output voltages for powering multiple devices.

The package 206 may provide mechanical protection and stability for the components 102, 104, 106, 112, 202, R and C, and electrical interconnectivity among the components 102, 104, 106, 112, 202, R and C. The module 206 may be a direct current (DC)-to-DC converter module, which is an electronic circuit that converts a source of DC from one voltage level to another. DC-to-DC converters may be used in portable electronic devices such as cellular phones and laptop computers, which may be supplied with DC power from batteries. The module 206 may also be implemented in a Point of Load (PoL) module, which provides an appropriate supply voltage to a processor, for example, a microprocessor, a digital signal processor (DSP) or an application specific integrated circuit (ASIC). A PoL allows processors and other components with different supply voltages to be mounted on the same motherboard.

Figure 3:
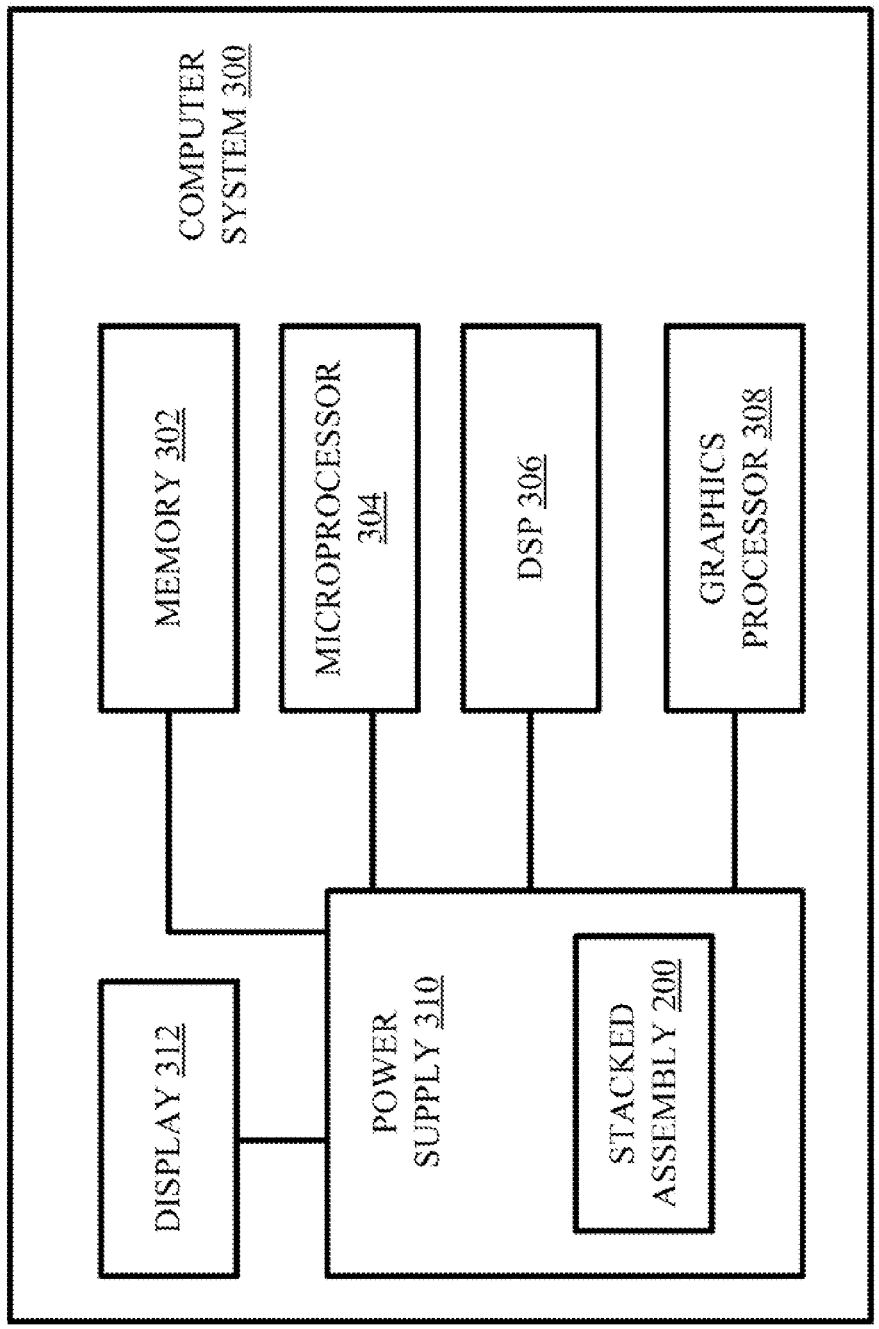
FIG. 3 illustrates an embodiment of a computer system in which an embodiment of a stacked inductor-package assembly may be implemented.

FIG. 3 illustrates an embodiment of a computer system 300 in which an embodiment of the stacked inductor-electronic package assembly 200 of FIG. 2 may be implemented. The computer system 300 may include a laptop computer, a desktop computer, or a smart cellular phone such as an iPhone®) or a Blackberry®. The computer system 300 may include a PoL power supply 310 in which the stacked inductor-electronic package assembly 200 may be implemented. The power supply 310 may provide power to one or more of a memory 302, a microprocessor 304, a digital signal processor 306, a graphics processor 308, and a display 312. The PoL power supply 310 may provide different input voltages to one or more of the various components 302, 304, 306, 308 and 312.

Figure 4:
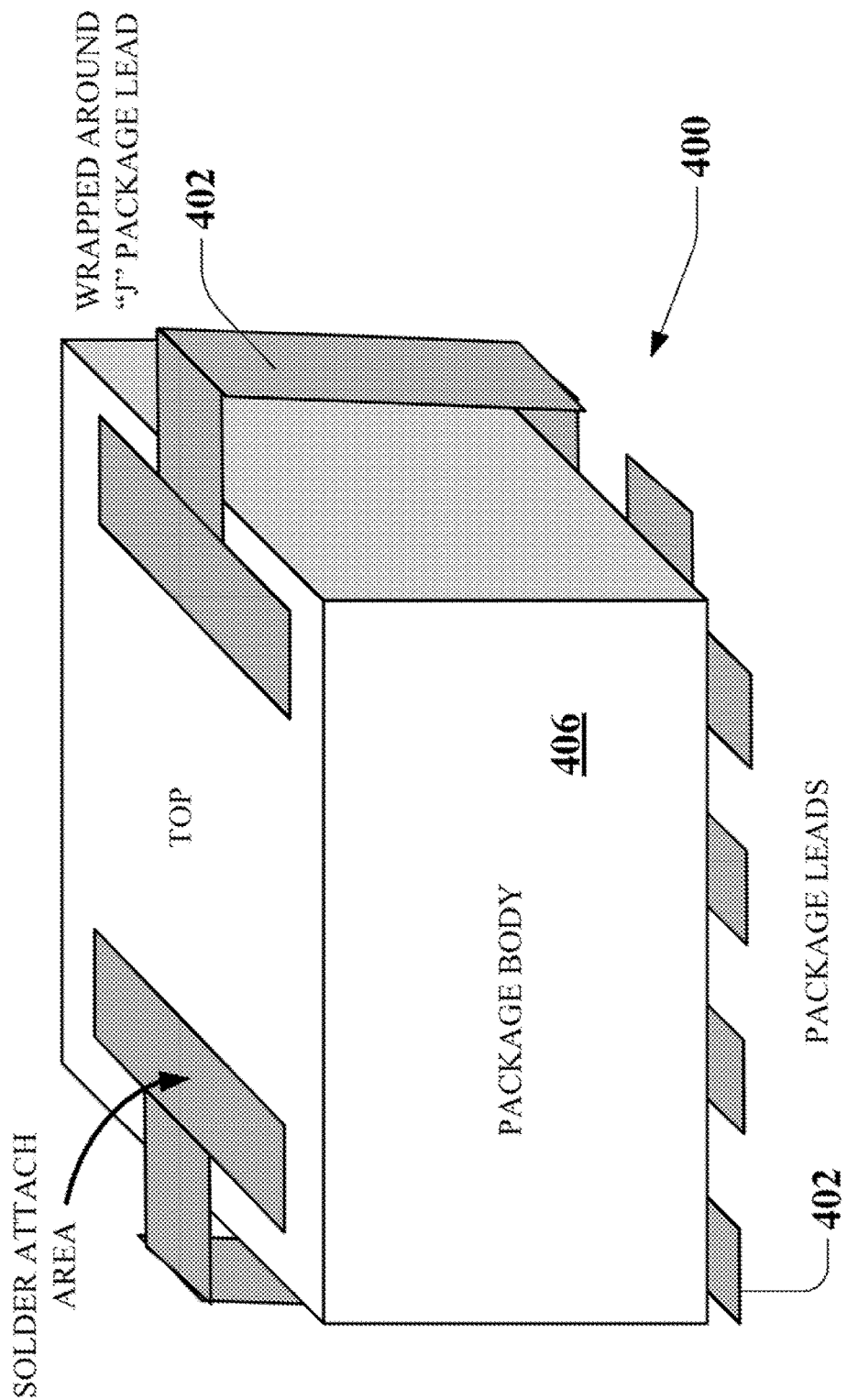
FIG. 4 illustrates an embodiment of a technique for stacking an inductor with a package.

Referring to FIG. 4, the at least one inductor 204 of FIG. 2 may be attached on top of the module 206 by using one or more embodiments of various manufacturing techniques. In an embodiment, as illustrated in FIG. 4, the electronic package leads 402 are bent during the trim and form operation in reverse J-bend formations on top of a package 406 of a module 400 such as a power-supply module. One or multiple leads 402 may be formed on the opposing sides of the top surface of the package 406. The bent leads 402 provide a solder attach area for the terminals (or solder pads) of the inductor 204. This technique may be referred to as a surface mounting type technique.

Figure 5:
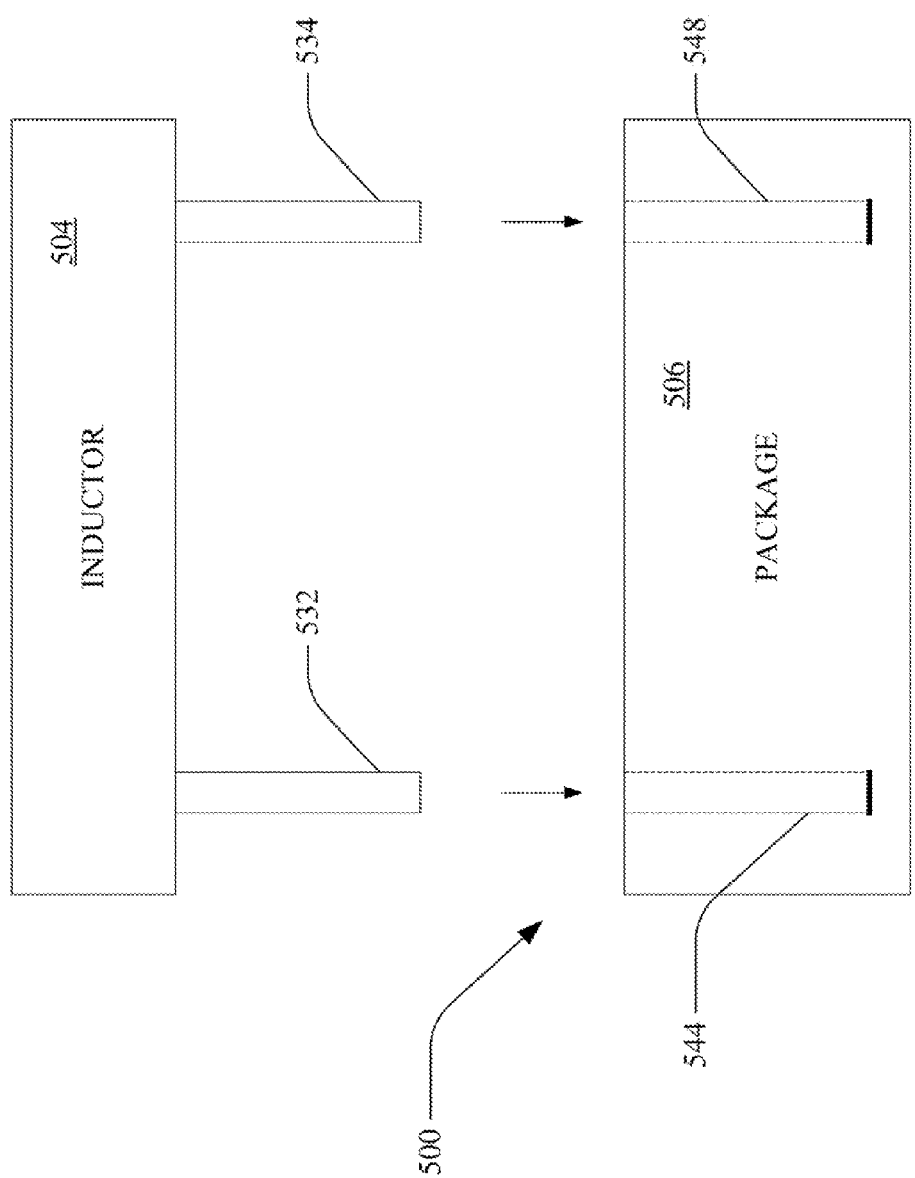
FIG. 5 illustrates another embodiment of a technique for stacking an inductor with a package.

In another embodiment as illustrated in FIG. 5, at least on inductor 504 is secured to a package 506 of a module 500 by inserting leads (or pins) 532 and 534 of the inductor 504 into the respective VIA holes 544 and 548. VIA stands for "Vertical Interconnect Access," which is a vertical electrical connection between different layers of conductors inside the package 506. A VIA opening begins at the top surface of the package 506 and runs down to the traces inside the package 506. VIAs may be pads with plated holes that provide electrical connections between copper traces on different layers of the module 500 including, for example, the different layers of a PCB such as the PCB 102 of FIG. 1. The VIA holes 544 and 548 may be made conductive by electroplating, or may be filled with annular rings or small rivets (not shown in FIG. 5). The leads 532 and 534 may also be made from conducting material, thereby electrically and physically connecting the inductor 504 with the module 500. The holes 544 and 548 may be referred to as blind VIAs because they are exposed only on one side (top) of the package 506. The blind holes 544 and 548 may be created in the package body 506 during fabrication by using mold pins. The technique illustrated in FIG. 5 may be referred to as an insertion type technique.

In yet another embodiment of the present invention, the blind holes 544 and 548 are filled with conductive solder paste by using the reflow process. The reflow process refers to heating and melting the solder to cause it to bond with other components. In this technique, the reflow process is used to fill the VIA holes 544 and 548 with solder. In this technique, the inductor includes bonding pads and is surface mounted to the package 506 by way of the solder filled holes 544 and 548. The reflow process is run again to attach the bonding pads of the inductor to the solder at the top of the holes 544 and 548. In the above embodiments, techniques such as solder dispensing, screen printing and solder dotting can be used to apply the solder to the leads and the holes.

Figure 6:
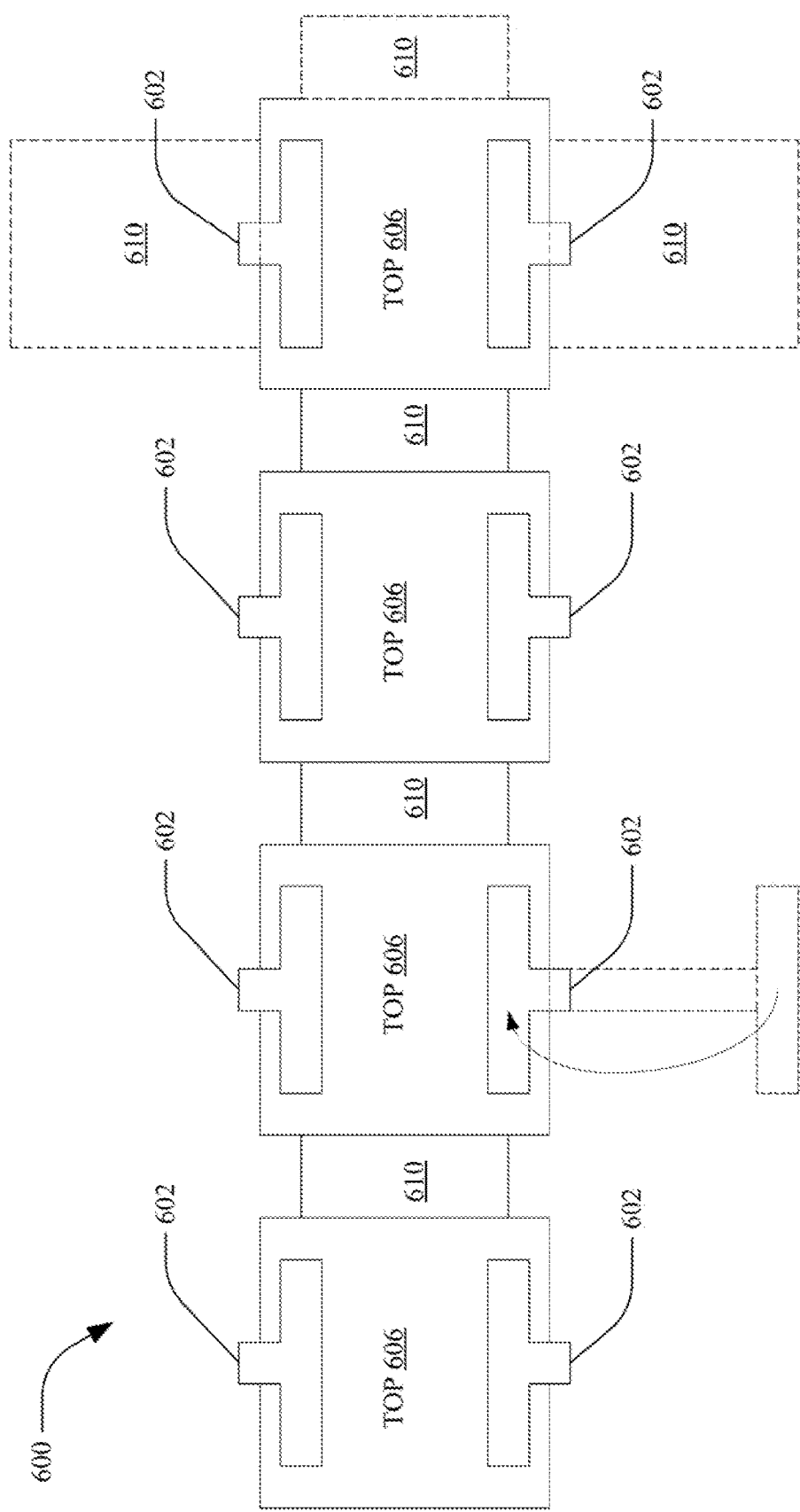
FIG. 6 illustrates an embodiment of a technique for fabricating a stacked inductor-package assembly.

Referring to FIG. 6, electronic modules such as power-supply modules may be mass produced in factories, and may be produced in batches. FIG. 6 illustrates an embodiment of a batch 600 of four modules 606. The four modules 606 are shown for illustration purposes and a batch 600 may include various numbers of modules. The batch 600 of modules 606 may be fabricated in a die and during fabrication each module 606 is attached to electrical conductor material such as gold or silicon, which extrudes externally from the module 606. The conductor material 610 may also interconnect the modules 606 of the batch during a portion of the fabrication process.

During an embodiment of the trim and form process, the conductor material 610 on all sides of each module 606 is cut (or trimmed) into strips of various dimensions and forms, depending on the requirements of the module. In an embodiment, during the trim and form operation, the conductor material 610 is trimmed into strips on two sides of each module 606 in a manner that allows the strips on the two sides to be bent to form reverse J-bend leads on top of the module 606. Embodiments of various techniques including sawing, dicing, and laser cutting may be used during the trim and form operation. Following the formation of the strips, the strips may be bent to form the two reverse J contacts on the top of the module 606.

Figure 7:
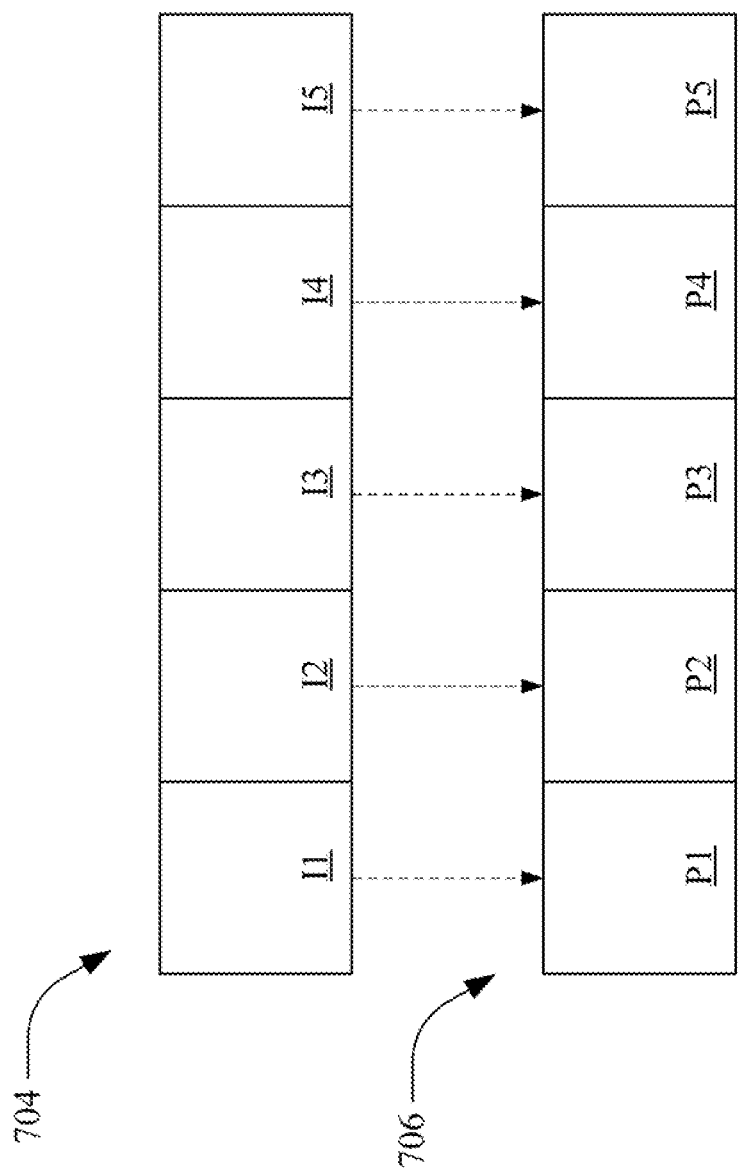
FIG. 7 illustrates another embodiment of a technique for fabricating a stacked inductor-package assembly.

Referring to FIG. 7, in an embodiment, a batch of inductors is fabricated to be assembled with a batch of electronic modules such as power-supply modules. A batch 704 of five inductors I1-I5 (each "inductor" may include one or more inductors) may be attached on top of a batch 706 of five electronic modules P1-P5 by using an embodiment the techniques described above in conjunction with FIGS. 4-5. The inductors I1-I5 and the modules P1-P5 may be made at different facilities by different manufacturers. Because the inductors I1-I5 may be coupled together during fabrication, the batch 704 may be referred to as a panel; likewise, because the modules P1-P5 may be coupled together during fabrication, the batch 706 may also be referred to as a panel.

An embodiment of the technique illustrated in FIG. 7 may be referred to as a "chocolate bar" assembly technique because the panels 704 and 706 resemble chocolate bars in that they include five interconnected pieces, e.g., identical inductors I1-I5, and five interconnected pieces, e.g., identical modules P1-P5, respectively. For ease of manufacturing, the attachments between the inductors I1-I5 and the attachments between the modules P1-P5 may be removed after the inductors I1-I5 are attached to the modules P1-P5. Individual stacked inductor-package assemblies 200 (FIG. 2) may be made by detaching the inductors I1-I5 from each other and the modules P1-P5 from each other after the inductor panel 704 and the module panel 706 have been assembled together.

Figure 8:
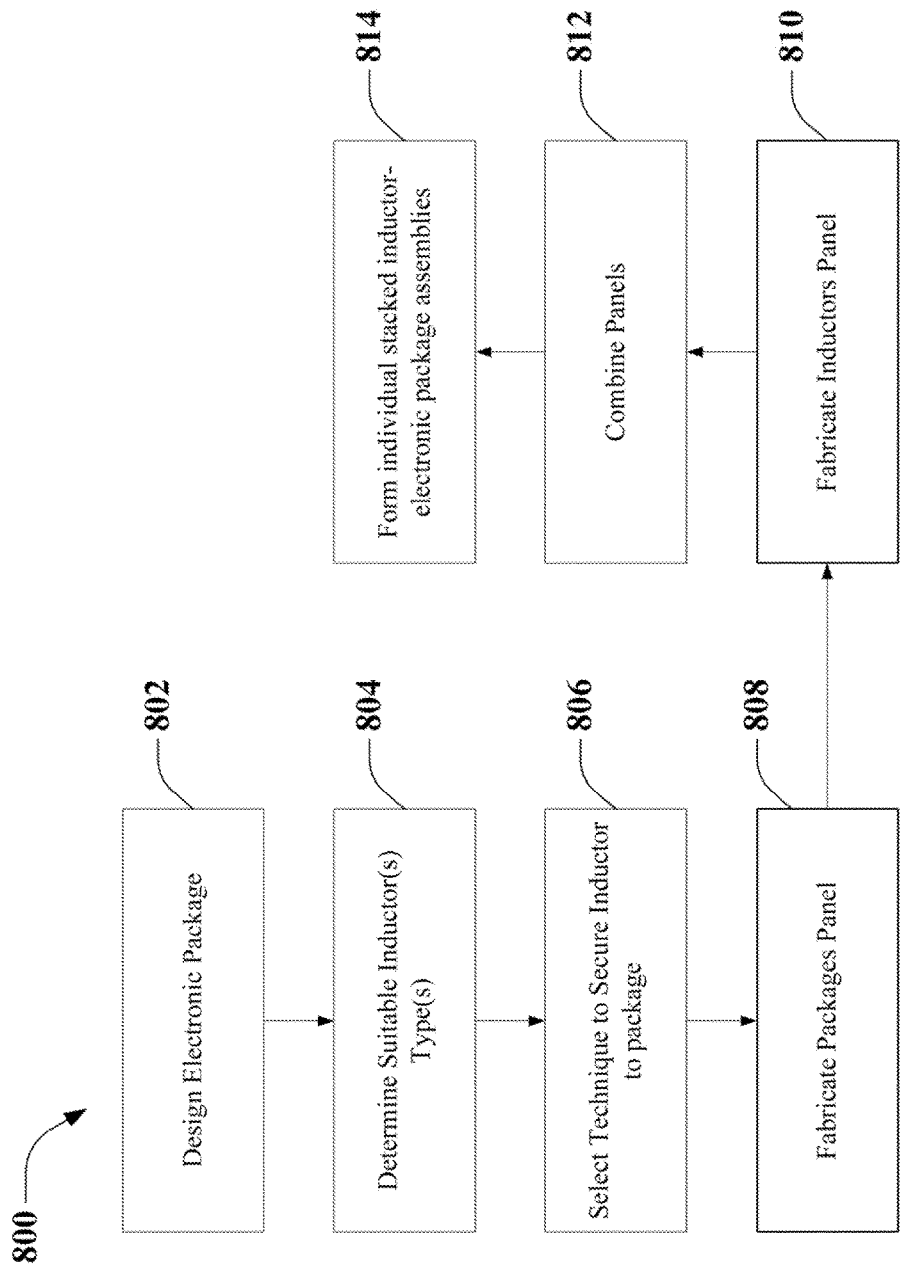
FIG. 8 illustrates a flow diagram of an embodiment of a technique for fabricating one or more stacked inductor-package assemblies.

FIG. 8 illustrates an exemplary high level flow diagram 800 illustrating an embodiment for fabricating stacked inductor-package assemblies such as an embodiment of the stacked inductor-package assembly 200 of FIG. 2.

At a step 802, a module designer determines if the module space vacated by the inductor of, e.g., FIG. 1 may be used for adding circuitry/functionality to the module, or if it is better to reduce the size of the module. The module designer then designs the module by determining the structure, function, and application for the module.

At step 804, the module designer determines the various types of inductors that may be suitable for the module.

At step 806, the module designer selects a technique for securing the inductor to the module, such techniques including, e.g., surface mounting (FIG. 4), insertion (FIG. 5), or some other technique. A factor that might affect this determination is the type of inductor the user-customer may prefer to use and the securing means the user-customer may prefer.

At step 808, a module panel including a batch of modules attached to each other is fabricated without including the inductors.

At step 810, an inductor panel including a batch of inductors attached to each other is fabricated.

At step 812, the inductor panel is attached to the top of the module panel.

At step 814, the inductors are detached from each other and the modules are detached from each other to create individual stacked inductor-package assemblies. A potential advantage of an embodiment is that an inductor and a corresponding module may be detachable from each other post-assembly. Therefore, if the inductor or the module fails in the field, it can be replaced with another inductor or module. Thus, the assembly may be repaired and the entire assembly need not be replaced if there is a failure of the inductor or the module, but not of both the inductor and the module.

What has been described above includes examples of the disclosed subject matter. It may not be, of course, possible to describe every conceivable combination of components or methodologies for purposes of describing the disclosed subject matter, but one of ordinary skill in the art may recognize that many further combinations and permutations of the disclosed subject matter are possible. Accordingly, the embodiments are intended to embrace all such alterations, modifications, and variations that fall within the spirit and scope of the disclosure.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosure.

In addition, while a particular feature may have been disclosed with respect to only one of several embodiments, such feature may be combined with one or more other features of the other embodiments as may be desired for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A method, comprising:
    fabricating a batch of a plurality of inductors connected to each other;
    fabricating a batch of modules;
    attaching the batch of inductors to the batch of modules; and
    separating the plurality of inductors from each other to create a plurality of assemblies, each assembly including a respective one of the plurality of inductors stacked on top of a module.

2. The method of claim 1 wherein attaching the inductors to the modules includes inserting straight leads of the inductors into Vertical Interconnect Access (VIA) holes of the modules.

3. The method of claim 2 wherein attaching the inductors to the modules includes filling the VIA holes of the electronic package with solder paste and attaching the inductors to the solder paste at the top of the holes.

4. The method of claim 3, further comprising:
    running the reflow process for filling the VIA holes with solder paste; and
    running the reflow process again to attach the inductors to the solder paste at the top of the holes.

5. The method of claim 1 wherein attaching the inductors to the modules includes bending external leads of the modules into reverse J-bend configurations, and attaching the inductors to the leads using solder paste.

6. The method of claim 1 wherein,
    the inductors are connected to each other with strips of insulating material; and
    the separation of the inductors from each other is performed by using a cutting technique.

7. The method of claim 1 wherein fabricating the batch of inductors is performed at a first facility and fabricating the batch of electronic packages is performed in at a second facility that is different than the first facility.

\* \* \* \* \*